United States Patent
Kristal

(10) Patent No.: US 10,510,991 B2
(45) Date of Patent: Dec. 17, 2019

(54) MASK STRUCTURE FOR PIXEL LAYOUT OF OLED PANEL, OLED PANEL AND METHOD FOR MANUFACTURING THE SAME

(71) Applicant: BOE TECHNOLOGY GROUP CO., LTD., Beijing (CN)

(72) Inventor: Boris Kristal, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/737,185

(22) PCT Filed: May 25, 2017

(86) PCT No.: PCT/CN2017/085902
§ 371 (c)(1),
(2) Date: Dec. 15, 2017

(87) PCT Pub. No.: WO2017/206792
PCT Pub. Date: Dec. 7, 2017

(65) Prior Publication Data
US 2018/0175331 A1 Jun. 21, 2018

(30) Foreign Application Priority Data
Jun. 2, 2016 (CN) .......................... 2016 1 0390355

(51) Int. Cl.
*H01L 29/08* (2006.01)
*H01L 51/56* (2006.01)
(Continued)

(52) U.S. Cl.
CPC ............ *H01L 51/56* (2013.01); *C23C 14/042* (2013.01); *H01L 27/3213* (2013.01);
(Continued)

(58) Field of Classification Search
CPC . H01L 51/56; H01L 51/5265; H01L 27/3218; H01L 27/3213; C23C 14/042
See application file for complete search history.

(56) References Cited

U.S. PATENT DOCUMENTS

2012/0069274 A1* 3/2012 Wang ................ G02F 1/133514
349/69
2012/0092238 A1* 4/2012 Hwang .................... G09G 3/20
345/55
(Continued)

FOREIGN PATENT DOCUMENTS

CN     103367391 A     10/2013
CN     103378126 A     10/2013
(Continued)

OTHER PUBLICATIONS

Office Action received for Chinese Patent Application No. 201610390355.5, dated May 3, 2018, 15 pages (8 pages of English Translation and 7 pages of Office Action).
(Continued)

*Primary Examiner* — Phuc T Dang
(74) *Attorney, Agent, or Firm* — Womble Bond Dickinson (US) LLP

(57) ABSTRACT

Embodiments of the present disclosure relate to a mask structure for pixel layout of an OLED panel, an OLED panel and a method for manufacturing the same. The mask structure for pixel layout of an OLED panel comprises: a deposition mask patterned on a substrate and surrounding each pixel region, the deposition mask comprising a first deposition wall and a second deposition wall arranged oppositely in pairs in a first direction, a third deposition wall and a fourth deposition wall arranged oppositely in pairs in a second direction intersecting the first direction, as well as a fifth deposition wall and a sixth deposition wall arranged oppositely in pairs in the first direction. The pixel layout
(Continued)

comprises a first sub-pixel region adjacent to the second deposition wall, a second sub-pixel region adjacent to the first deposition wall, and a third sub-pixel region adjacent to the fourth deposition wall.

29 Claims, 7 Drawing Sheets

(51) Int. Cl.
*C23C 14/04* (2006.01)
*H01L 27/32* (2006.01)
*H01L 51/00* (2006.01)
*H01L 51/52* (2006.01)

(52) U.S. Cl.
CPC ...... *H01L 27/3218* (2013.01); *H01L 27/3246* (2013.01); *H01L 51/0011* (2013.01); *H01L 51/5265* (2013.01); *H01L 2227/323* (2013.01); *H01L 2251/5315* (2013.01)

(56) References Cited

U.S. PATENT DOCUMENTS

2013/0277645 A1   10/2013   Antonenkov
2016/0155777 A1*  6/2016   Kabe ...................... H01L 27/32
                                                                257/89

FOREIGN PATENT DOCUMENTS

| CN | 103529614 A | 1/2014 |
| CN | 105870158 A | 8/2016 |
| CN | 205645820 U | 10/2016 |

OTHER PUBLICATIONS

International Search Report received for PCT Patent Application No. PCT/CN2017/085902, dated Aug. 31, 2017, 6 pages (2 pages of English Translation and 4 pages of Original Document).

* cited by examiner

MASK STRUCTURE FOR PIXEL LAYOUT OF OLED PANEL, OLED PANEL AND METHOD FOR MANUFACTURING THE SAME

CROSS REFERENCES TO RELATED APPLICATIONS

The present application is the U.S. national phase entry of PCT/CN2017/085902, with an international filling date of May 25, 2017, which claims the priority of Chinese patent application No. 201610390355.5 filed on Jun. 2, 2016, the disclosures thereof are incorporated herein as part of the present application by reference.

TECHNICAL FIELD

Embodiments of the present disclosure relate to a mask structure for pixel layout of an OLED panel, an OLED panel and a method for manufacturing the same.

BACKGROUND ART

In contrast with liquid crystal displays (LCD), organic electroluminescent displays are self-luminous and require no backlight. Thus, the weight can be reduced and the size can be minimized. Moreover, organic electroluminescent displays feature low driving voltage, high illumination efficiency, and wide view angle, thus obtaining attracted wide attention.

An organic electroluminescent display comprises a plurality of organic light-emitting display (OLED) devices for displaying images. Each OLED comprises an anode, an organic light-emitting layer and a cathode. The anode and the cathode provide holes and electrons to the organic light-emitting layer, where the holes and the electrons are recombined to form excitons. When the excitons settle down to a bottom steady state, they generate light with predetermined wavelengths. According to material characteristics of the organic light-emitting layer, light with wavelengths corresponding to, for example, red, green and blue, is generated.

In the organic electroluminescent display, each organic light-emitting layer realizing red (R), green (G) and blue (B) should be laid out for each pixel, so as to achieve full color display. The conventional manufacturing process of an OLED device comprises vacuum deposition, jet-printing, nozzle-printing, laser ablation, laser induced thermal imaging or the like. Among these methods, devices with best characteristics are produced by a vacuum deposition process. However, the vacuum deposition requires a fine metal mask (FMM) to generate a layout required by the high-resolution display. FMM has many problems such as high cost for mass production, and difficulties for stretching and maintenance. Moreover, it is necessary to accurately align FMM with the substrate before deposition starts. For a large-sized substrate, the alignment is difficult, especially when high resolution is required. In addition, the alignment process further requires complicated accessories to be added into the evaporation chamber for dealing with the alignment process.

SUMMARY

In an aspect of the present disclosure, an embodiment of the present disclosure provides a mask structure for pixel layout of an OLED panel, comprising a deposition mask patterned on a substrate and surrounding each pixel region. The deposition mask comprises a first deposition wall and a second deposition wall arranged oppositely in pairs in a first direction, a third deposition wall and a fourth deposition wall arranged oppositely in pairs in a second direction intersecting the first direction, as well as a fifth deposition wall and a sixth deposition wall arranged oppositely in pairs in the first direction.

The pixel layout comprises a first sub-pixel region adjacent to the second deposition wall, a second sub-pixel region adjacent to the first deposition wall, and a third sub-pixel region adjacent to the fourth deposition wall.

In an embodiment of the present disclosure, the pixel layout further comprises a fourth sub-pixel region adjacent to the third deposition wall.

In an embodiment of the present disclosure, the first deposition wall and the second deposition wall are spaced apart by a first distance L1 in the first direction, the third deposition wall and the fourth deposition wall are spaced apart by a second distance L2 in the second direction, and the fifth deposition wall and the sixth deposition wall are spaced apart by a third distance L3 in the first direction.

Further, in a section obtained from cutting along the first direction, the substrate and a connection line from an inner edge of the first sub-pixel region to a top portion of the first deposition wall enclose an angle $\alpha 1$, the substrate and a connection line from an inner edge of the second sub-pixel region to a top portion of the second deposition wall enclose an angle $\alpha 2$, and in a section obtained from cutting along the second direction, the substrate and a connection line from an inner edge of the third sub-pixel region to a top portion of the third deposition wall enclose an angle $\alpha 3$, wherein $\alpha 1$, $\alpha 2$ and $\alpha 3$ are all greater than 0 degrees and smaller than 90 degrees, Moreover, a height h1 of the first deposition wall, a height h2 of the second deposition wall, a height h3 of the third deposition wall, a height h4 of the fourth deposition wall, a height h5 of the fifth deposition wall, and a height h6 of the sixth deposition wall satisfy the following relationship:

$$h5 > L3 \times \tan(\alpha 1);$$

$$h6 > L3 \times \tan(\alpha 2)$$

In an embodiment of the present disclosure, the pixel layout comprises a fourth sub-pixel region adjacent to the third deposition wall. In a section obtained from cutting along the second direction, the substrate and a connection line from an inner edge of the fourth sub-pixel region to a top portion of the fourth deposition wall enclose an angle $\alpha 4$, wherein $\alpha 4$ is greater than 0 degrees and smaller than 90 degrees.

In an embodiment of the present disclosure, at least two of $\alpha 1$, $\alpha 2$ and $\alpha 3$ are equal to each other.

In an embodiment of the present disclosure, $\alpha 4$ is equal to at least one of $\alpha 1$, $\alpha 2$ and $\alpha 3$.

In an embodiment of the present disclosure, the height h5 of the fifth deposition wall and the height h6 of the sixth deposition wall are greater than the height h1 of the first deposition wall and the height h2 of the second deposition wall. Also, the first deposition wall and the fifth deposition wall have inner side walls located in a same plane, and the second deposition wall and the sixth deposition wall have inner side walls located in a same plane.

In an embodiment of the present disclosure, the deposition mask comprises two pairs of the fifth deposition wall and the sixth deposition wall, wherein a first pair of the fifth deposition wall and the sixth deposition wall and a second pair of the fifth deposition wall and the sixth deposition wall are respectively located on opposite sides of the first deposition wall and the second deposition wall arranged in pairs. The deposition mask further comprises two pairs of a seventh deposition wall and an eighth deposition wall arranged oppositely and spaced apart by a fourth distance L4 in the second direction, wherein a first pair of the seventh deposition wall and the eighth deposition wall and a second pair of the seventh deposition wall and the eighth deposition wall are respectively located on opposite sides of the third deposition wall and the fourth deposition wall arranged in pairs.

The height h7 of the seventh deposition wall and the height h8 of the eighth deposition wall satisfy the following relationship:

$$h7 > L4 \times \tan(\alpha 3);$$

$$h8 > L4 \times \tan(\alpha 4),$$

Further, the first deposition wall is offset towards the outside of the pixel region by a width b2 of the second sub-pixel region in the first direction with relative to the fifth deposition wall, the second deposition wall is offset towards the outside of the pixel region by a width b1 of the first sub-pixel region in the first direction with relative to the sixth deposition wall, the third deposition wall is offset towards the outside of the pixel region by a width b4 of the fourth sub-pixel region in the second direction with relative to the seventh deposition wall, and the fourth deposition wall is offset towards the outside of the pixel region by a width b3 of the third sub-pixel region in the second direction with relative to the eighth deposition wall.

In an embodiment of the present disclosure, the first to the eighth deposition walls have the same height.

In an embodiment of the present disclosure, the deposition mask is made of one or more selected from the group consisting of photosensitive polyimide, polyacrylates, phenolic resin, and epoxy resin.

In an embodiment of the present disclosure, the height h1 of the first deposition wall and the height h2 of the second deposition wall fall within the range of 0.02~10000 μm. Further, the height h3 of the third deposition wall, the height h4 of the fourth deposition wall, the height h5 of the fifth deposition wall, and the height h6 of the sixth deposition wall fall within the range of 0.05~34000 μm.

In an embodiment of the present disclosure, the height h1 of the first deposition wall and the height h2 of the second deposition wall fall within the range of 1.8~95 μm. Further, the height h3 of the third deposition wall, the height h4 of the fourth deposition wall, the height h5 of the fifth deposition wall, and the height h6 of the sixth deposition wall fall within the range of 4.8~165 μm.

In an embodiment of the present disclosure, the height of each of the first deposition wall, the second deposition wall, the third deposition wall, the fourth deposition wall, the fifth deposition wall, the sixth deposition wall, the seventh deposition wall and the eighth deposition wall falls within the range of 0.07~45000 μm.

In an embodiment of the present disclosure, the height of each of the first deposition wall, the second deposition wall, the third deposition wall, the fourth deposition wall, the fifth deposition wall, the sixth deposition wall, the seventh deposition wall and the eighth deposition wall falls within the range of 5.4~346 μm.

In another aspect of the present disclosure, an embodiment of the present disclosure provides an OLED panel comprising a pixel structure. Specifically, the pixel structure comprises a first sub-pixel region, a second sub-pixel region and a third sub-pixel region, wherein the first sub-pixel region and the second sub-pixel region are aligned in a first direction, extending in parallel with each other in a second direction intersecting the first direction, and the third sub-pixel region is located at one end of the first and the second sub-pixel regions in the second direction, extending in the first direction.

In an embodiment of the present disclosure, the pixel structure further comprises a fourth sub-pixel region located at the other end of the first and the second sub-pixel regions in the second direction, extending in the first direction, wherein the third sub-pixel region and the fourth sub-pixel region are aligned with each other in the second direction.

In an embodiment of the present disclosure, two sides of the third sub-pixel region in the first direction are aligned with outer sides of the first sub-pixel region and the second sub-pixel region in the first direction respectively.

In an embodiment of the present disclosure, two sides of the fourth sub-pixel region in the first direction are aligned with outer sides of the first to the third sub-pixel regions in the first direction respectively.

In an embodiment of the present disclosure, an outer side of the third sub-pixel region in the second direction and an outer side of the fourth sub-pixel region in the second direction are respectively offset outwards by a width of the third sub-pixel region and a width of the fourth sub-pixel region with relative to two outer sides of the first sub-pixel region and the second sub-pixel region (that are arranged in pairs) in the second direction. Also, an outer side of the first sub-pixel region in the first direction and an outer side of the second sub-pixel region in the first direction are respectively offset outwards by a width of the first sub-pixel region and a width of the second sub-pixel region with relative to two outer sides of the third sub-pixel region and the fourth sub-pixel region (that are arranged in pairs) in the first direction.

In an embodiment of the present disclosure, the OLED panel further comprises a deposition mask patterned and surrounding the pixel structure. The deposition mask comprises a first deposition wall and a second deposition wall arranged oppositely in pairs in a first direction, a third deposition wall and a fourth deposition wall arranged oppositely in pairs in a second direction intersecting the first direction, as well as a fifth deposition wall and a sixth deposition wall arranged oppositely in pairs in the first direction.

Further, the first sub-pixel region is adjacent to the second deposition wall, the second sub-pixel region is adjacent to the first deposition wall, and the third sub-pixel region is adjacent to the fourth deposition wall.

In an embodiment of the present disclosure, the first deposition wall and the second deposition wall are spaced apart by a first distance L1 in the first direction, the third deposition wall and the fourth deposition wall are spaced apart by a second distance L2 in the second direction, and the fifth deposition wall and the sixth deposition wall are spaced apart by a third distance L3 in the first direction, In a section obtained from cutting along the first direction, the substrate and a connection line from an inner edge of the first sub-pixel region to a top portion of the first deposition wall enclose an angle $\alpha 1$, the substrate and a connection line from an inner edge of the second sub-pixel region to a top portion of the second deposition wall enclose an angle $\alpha 2$, and in a section obtained from cutting along the second direction, the substrate and a connection line from an inner edge of the third sub-pixel region to a top portion of the third deposition wall enclose an angle α3, wherein α1, α2 and α3 are all greater than 0 degrees and smaller than 90 degrees.

Moreover, a height h1 of the first deposition wall, a height h2 of the second deposition wall, a height h3 of the third deposition wall, a height h4 of the fourth deposition wall, a height h5 of the fifth deposition wall, and a height h6 of the sixth deposition wall satisfy the following relationship:

$$h5>L3\times\tan(\alpha 1);$$

$$h6>L3\times\tan(\alpha 2).$$

In an embodiment of the present disclosure, the deposition mask comprises two pairs of the fifth deposition wall and the sixth deposition wall, wherein a first pair of the fifth deposition wall and the sixth deposition wall and a second pair of the fifth deposition wall and the sixth deposition wall are respectively located on opposite sides of the first deposition wall and the second deposition wall arranged in pairs. The deposition mask further comprises two pairs of a seventh deposition wall and an eighth deposition wall arranged oppositely and spaced apart by a fourth distance L4 in the second direction, wherein a first pair of the seventh deposition wall and the eighth deposition wall and a second pair of the seventh deposition wall and the eighth deposition wall are respectively located on opposite sides of the third deposition wall and the fourth deposition wall arranged in pairs.

Additionally, a height h7 of the seventh deposition wall and a height h8 of the eighth deposition wall satisfy the following relationship:

$$h7>L4\times\tan(\alpha 3);$$

$$h8>L4\times\tan(\alpha 4).$$

Furthermore, the first deposition wall is offset towards the outside of the pixel region by a width b2 of the second sub-pixel region in the first direction with relative to the fifth deposition wall, the second deposition wall is offset towards the outside of the pixel region by a width b1 of the first sub-pixel region in the first direction with relative to the sixth deposition wall, the third deposition wall is offset towards the outside of the pixel region by a width b4 of the fourth sub-pixel region in the second direction with relative to the seventh deposition wall, and the fourth deposition wall is offset towards the outside of the pixel region by a width b3 of the third sub-pixel region in the second direction with relative to the eighth deposition wall.

In an embodiment of the present disclosure, the first deposition wall, the second deposition wall, the third deposition wall, the fourth deposition wall, the fifth deposition wall, the sixth deposition wall, the seventh deposition wall, and the eighth deposition wall have the same height.

In an embodiment of the present disclosure, the height h1 of the first deposition wall and the height h2 of the second deposition wall fall within the range of 0.02~10000 μm; and the height h3 of the third deposition wall, the height h4 of the fourth deposition wall, the height h5 of the fifth deposition wall, and the height h6 of the sixth deposition wall fall within the range of 0.05~34000 μm.

In an embodiment of the present disclosure, the height h1 of the first deposition wall and the height h2 of the second deposition wall fall within the range of 1.8~95 μm; and the height h3 of the third deposition wall, the height h4 of the fourth deposition wall, the height h5 of the fifth deposition wall, and the height h6 of the sixth deposition wall fall within the range of 4.8~165 μm.

In an embodiment of the present disclosure, the height of each of the first deposition wall, the second deposition wall, the third deposition wall, the fourth deposition wall, the fifth deposition wall, the sixth deposition wall, the seventh deposition wall, and the eighth deposition wall falls within the range of 0.07~45000 μm.

In an embodiment of the present disclosure, the height of each of the first deposition wall, the second deposition wall, the third deposition wall, the fourth deposition wall, the fifth deposition wall, the sixth deposition wall, the seventh deposition wall, and the eighth deposition wall falls within the range of 5.4~346 μm.

In yet another aspect of the present disclosure, an embodiment of the present disclosure provides a method for manufacturing an OLED panel. The method comprises steps of: forming on a substrate a deposition mask patterned and surrounding each pixel region, the deposition mask comprising a first deposition wall and a second deposition wall arranged oppositely in pairs in a first direction, a third deposition wall and a fourth deposition wall arranged oppositely in pairs in a second direction intersecting the first direction, and a fifth deposition wall and a sixth deposition wall arranged oppositely in pairs in the first direction; and depositing obliquely towards the second deposition wall in the first direction a first sub-pixel material onto a first sub-pixel region adjacent to the second deposition wall, depositing obliquely towards the first deposition wall in the first direction a second sub-pixel material onto a second sub-pixel region adjacent to the first deposition wall, and depositing obliquely towards the fourth deposition wall in the second direction a third sub-pixel material onto a third sub-pixel region adjacent to the fourth deposition wall.

In an embodiment of the present disclosure, the method further comprises a step of: depositing obliquely towards the third deposition wall in the second direction a fourth sub-pixel material onto a fourth sub-pixel region adjacent to the third deposition wall.

In an embodiment of the present disclosure, the first deposition wall and the second deposition wall are spaced apart by a first distance L1 in the first direction, the third deposition wall and the fourth deposition wall are spaced apart by a second distance L2 in the second direction, and the fifth deposition wall and the sixth deposition wall are spaced apart by a third distance L3 in the first direction, Oblique deposition angles of the first, the second and the third sub-pixel materials are α1, α2 and α3 respectively, wherein α1, α2 and α3 are angles enclosed between the substrate and deposition directions of the first, the second and the third sub-pixel materials respectively, and are all greater than 0 degrees and smaller than 90 degrees, A height h1 of the first deposition wall, a height h2 of the second deposition wall, a height h3 of the third deposition wall, a height h4 of the fourth deposition wall, a height h5 of the fifth deposition wall, and a height h6 of the sixth deposition wall satisfy the following relationship:

$$h5>L3\times\tan(\alpha 1);$$

$$h6>L3\times\tan(\alpha 2).$$

In an embodiment of the present disclosure, an oblique deposition angle of the fourth sub-pixel material is α4, wherein α4 is an angle enclosed between the substrate and a deposition direction of the fourth sub-pixel material, and is greater than 0 degrees and smaller than 90 degrees.

In an embodiment of the present disclosure, at least two of α1, α2 and α3 are equal to each other.

In an embodiment of the present disclosure, α4 is equal to at least one of α1, α2 and α3.

In an embodiment of the present disclosure, the height h5 of the fifth deposition wall and the height h6 of the sixth deposition wall are greater than the height h1 of the first deposition wall and the height h2 of the second deposition wall. Further, the first deposition wall and the fifth deposition wall have inner side walls located in a same plane, and the second deposition wall and the sixth deposition wall have inner side walls located in a same plane.

In an embodiment of the present disclosure, the deposition mask comprises two pairs of the fifth deposition wall and the sixth deposition wall, wherein a first pair of the fifth deposition wall and the sixth deposition wall and a second pair of the fifth deposition wall and the sixth deposition wall are respectively located on opposite sides of the first deposition wall and the second deposition wall arranged in pairs. Additionally, the deposition mask further comprises two pairs of a seventh deposition wall and an eighth deposition wall arranged oppositely in parallel and spaced apart by a fourth distance L4 in the second direction, wherein a first pair of the seventh deposition wall and the eighth deposition wall and a second pair of the seventh deposition wall and the eighth deposition wall are respectively located on opposite sides of the third deposition wall and the fourth deposition wall arranged in pairs, A height h7 of the seventh deposition wall and a height h8 of the eighth deposition wall satisfy the following relationship:

$$h7 > L4 \times \tan(\alpha 3);$$

$$h8 > L4 \times \tan(\alpha 4).$$

Further, the first deposition wall is offset towards the outside of the pixel region by a width b2 of the second sub-pixel region in the first direction with relative to the fifth deposition wall, the second deposition wall is offset towards the outside of the pixel region by a width b1 of the first sub-pixel region in the first direction with relative to the sixth deposition wall, the third deposition wall is offset towards the outside of the pixel region by a width b4 of the fourth sub-pixel region in the second direction with relative to the seventh deposition wall, and the fourth deposition wall is offset towards the outside of the pixel region by a width b3 of the third sub-pixel region in the second direction with relative to the eighth deposition wall.

In an embodiment of the present disclosure, the first deposition wall, the second deposition wall, the third deposition wall, the fourth deposition wall, the fifth deposition wall, the sixth deposition wall, the seventh deposition wall, and the eighth deposition wall have the same height.

In an embodiment of the present disclosure, the deposition mask is made of one or more selected from the group consisting of photosensitive polyimide, polyacrylates, phenolic resin and epoxy resin.

In an embodiment of the present disclosure, the height h1 of the first deposition wall and the height h2 of the second deposition wall fall within the range of 0.02~10000 μm; and the height h3 of the third deposition wall, the height h4 of the fourth deposition wall, the height h5 of the fifth deposition wall, and the height h6 of the sixth deposition wall fall within the range of 0.05~34000 μm.

In an embodiment of the present disclosure, the height h1 of the first deposition wall and the height h2 of the second deposition wall fall within the range of 1.8~95 μm; and the height h3 of the third deposition wall, the height h4 of the fourth deposition wall, the height h5 of the fifth deposition wall, and the height h6 of the sixth deposition wall fall within the range of 4.8~165 μm.

In an embodiment of the present disclosure, the height of each of the first deposition wall, the second deposition wall, the third deposition wall, the fourth deposition wall, the fifth deposition wall, the sixth deposition wall, the seventh deposition wall, and the eighth deposition wall falls within the range of 0.07~45000 μm.

In an embodiment of the present disclosure, the height of each of the first deposition wall, the second deposition wall, the third deposition wall, the fourth deposition wall, the fifth deposition wall, the sixth deposition wall, the seventh deposition wall, and the eighth deposition wall falls within the range of 5.4~346 m.

BRIEF DESCRIPTION OF THE DRAWINGS

In order to illustrate technical solutions in the embodiments of the present disclosure more clearly, drawings to be used in depictions of the embodiments will be briefly introduced as follows. Apparently, the drawings in the following depictions are only some embodiments of the present disclosure, and for a person having ordinary skills in the art, other drawings can also be obtained from these drawings without any inventive efforts.

DETAILED DESCRIPTION OF THE EMBODIMENTS

In order to render goals, technical solutions and advantages of the embodiments of the present disclosure clearer, technical solutions in the embodiments of the present disclosure shall be described clearly and completely as follows with reference to the drawings in the embodiments of the present disclosure. Apparently, the embodiments described below are only part of the embodiments of the present disclosure, rather than all of them. Based on the embodiments in the present disclosure, all other embodiments obtainable by a person having ordinary skills in the art without any inventive efforts shall fall within the protection scope of the present disclosure.

Besides, terms such as "first" and "second" are used only for descriptive purposes and should not be construed as indicating or implying relative importance or hinting at the number of the indicated technical features. Thereby, features defined by "first" and "second" can comprise one or more such features explicitly or implicitly.

Exemplary embodiments of the present disclosure will be illustrated as follows with reference to FIGS. 1-12.

Figure 1:
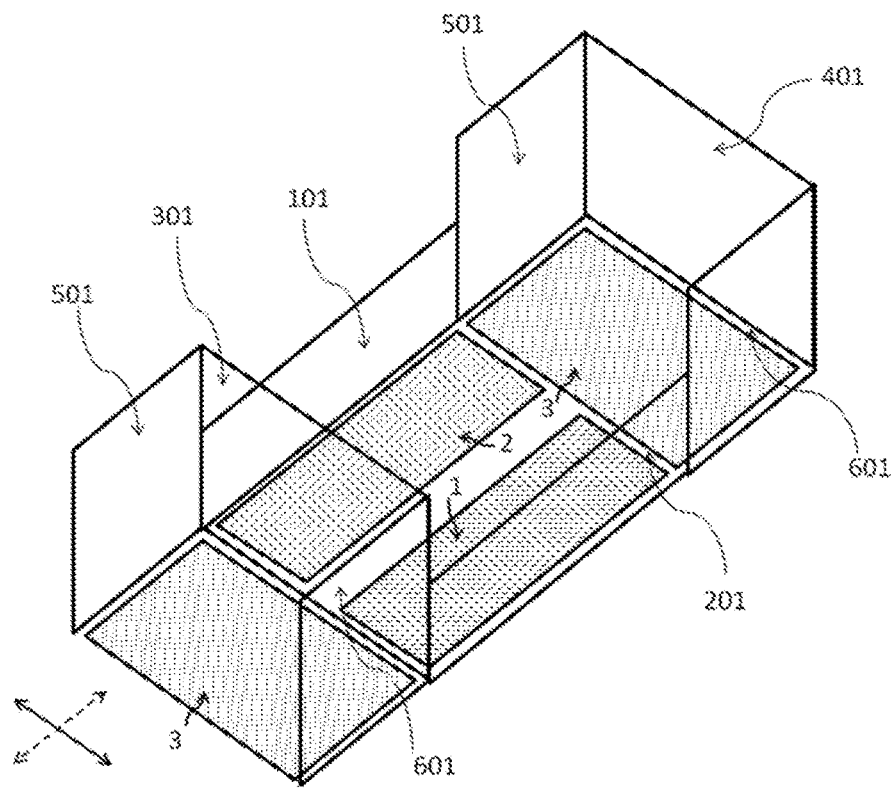
FIG. 1 is a schematic perspective view for the shape of a deposition mask that can be used as an embedded mask when deposition is performed to provide pixel layout of an OLED panel according to an embodiment of the present disclosure.
Figure 2:
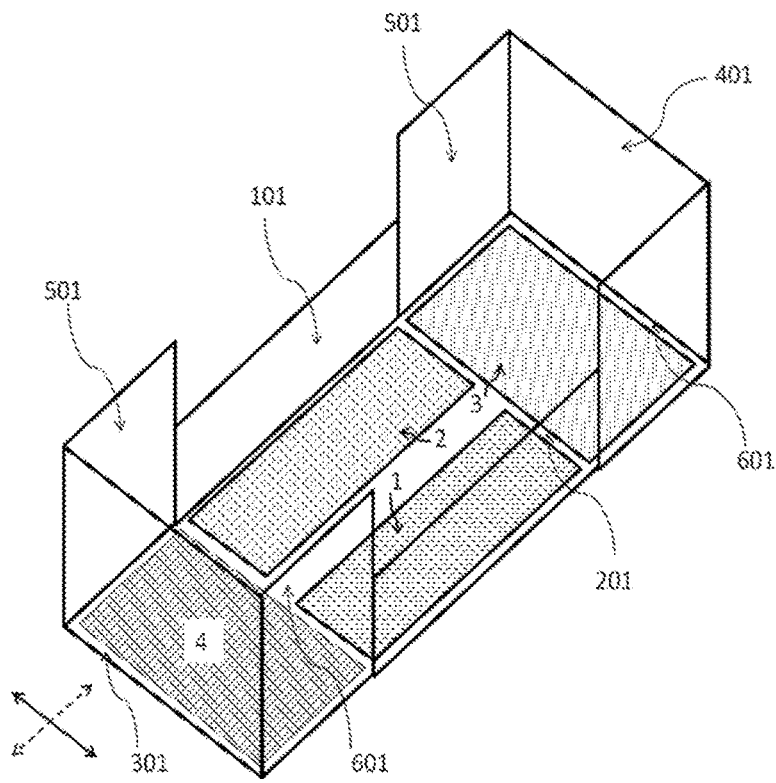
FIG. 2 is a schematic perspective view for the shape of a deposition mask that can be used as an embedded mask when deposition is performed to provide pixel layout of an OLED panel according to another embodiment of the present disclosure.

As shown in FIGS. 1-8, prior to depositing organic materials of an OLED device of an OLED panel, a deposition mask is formed on top of a substrate such as a TFT panel by for example spin-coating and subsequent photolithography and etching. The deposition mask is formed such that deposition walls are formed surrounding a pixel region, as shown in FIGS. 1 and 2. That is to say, a deposition mask patterned and surrounding each pixel region is formed on the substrate. Specifically, the deposition mask comprises a first deposition wall 101 and a second deposition wall 201 arranged oppositely in parallel and spaced apart by a first distance L1 in a first direction, a third deposition wall 301 and a fourth deposition wall 401 arranged oppositely in parallel and spaced apart by a second distance L2 in a second direction intersecting the first direction, and a fifth deposition wall 501 and a sixth deposition wall 601 arranged oppositely in parallel and spaced apart by a third distance L3 in the first direction.

In related drawings, the first direction is indicated by a solid line with double arrows, and the second direction intersecting the first direction is indicated by a dotted line with double arrows.

The first direction can form any angle with respect to the second direction. In an exemplary embodiment, the first direction is orthogonal to the second direction.

As is well known by one skilled in the art, pixels are repetitive units capable of emitting light in a patterned light-emitting display structure. The structure of each pixel can constitute one or more sub-pixels. For example, in a full color device, each pixel can constitute three or more sub-pixels.

In an exemplary embodiment as shown in FIG. 1, the formed deposition mask surrounds each pixel region, and each pixel region comprises three sub-pixel regions 1-3 to be formed in steps that follow.

In an exemplary embodiment as shown in FIG. 2, the formed deposition mask surrounds each pixel region, and each pixel region comprises four sub-pixel regions 1-4 to be formed in steps that follow.

The deposition mask can be formed by photosensitive materials. In an exemplary embodiment, the deposition mask can be formed by photoresist. With a deposition mask formed of photoresist, the deposition mask layer can be formed into a desired pattern by a mature photolithography process.

In an exemplary embodiment, the deposition mask can be made of one or more selected from the group consisting of photosensitive polyimide, polyacrylates, phenolic resin and epoxy resin. For example, the photosensitive polyimide can be polydimethyl glutarimide (PMGI), PW-1000, PW-1200 and PW-1500 manufactured by Toray, or the like.

The substrate can be any substrate suitable for manufacturing an OLED panel device. In an exemplary embodiment, the substrate can be a TFT panel.

After the deposition mask patterned and surrounding each pixel region is formed on the substrate, as shown in FIGS. 3-7, a first sub-pixel material from a first material source 102 is deposited obliquely at an angle $\alpha 1$ towards the second deposition wall 201 in the first direction onto a first sub-pixel region 1 adjacent to the second deposition wall 201 (FIG. 3), a second sub-pixel material from a second material source 202 is deposited obliquely at an angle $\alpha 2$ towards the first deposition wall 101 in the first direction onto a second sub-pixel region 2 adjacent to the first deposition wall 101 (FIG. 4), and a third sub-pixel material from a third material source 302 is deposited obliquely at an angle $\alpha 3$ towards the fourth deposition wall 401 in the second direction onto a third sub-pixel region 3 adjacent to the fourth deposition wall 401 (FIG. 7), wherein $\alpha 1$, $\alpha 2$ and $\alpha 3$ are angles enclosed between the substrate and deposition directions of the first, the second and the third sub-pixel materials respectively, and are all greater than 0 degrees and smaller than 90 degrees. Also, the first, the second and the third sub-pixel materials differ from each other.

Figure 3:
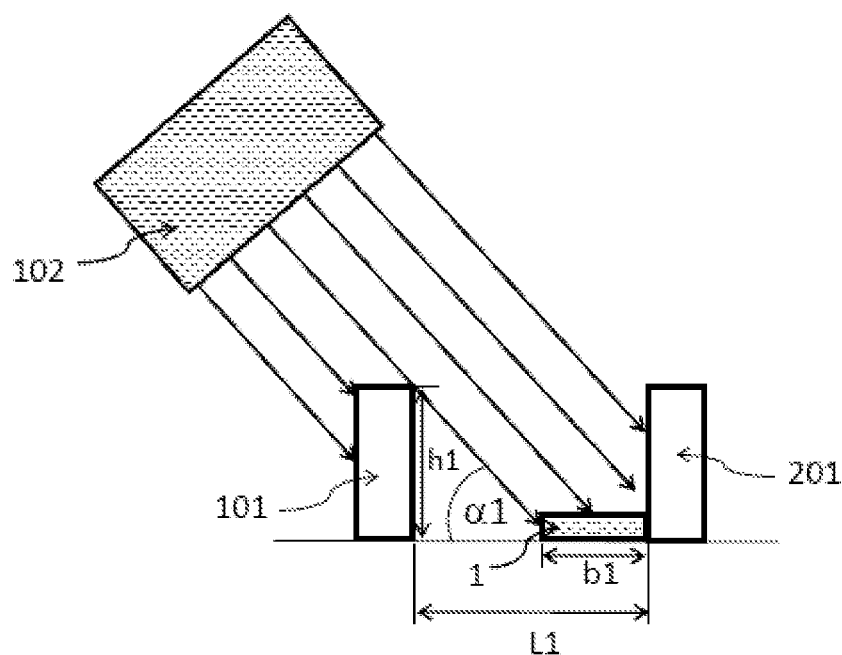
FIG. 3 is a schematic view for deposition of materials of the first sub-pixel region from a first sub-pixel material source at an oblique angle α1 according to an embodiment of the present disclosure.

As shown in FIG. 3, the first sub-pixel material from the first material source 102 is deposited obliquely onto the first sub-pixel region 1 at an angle $\alpha 1$ towards the second deposition wall 201 in the first direction. During deposition of materials from the first material source 102, the deposition wall 101 forms an occluded region between the deposition wall 101 and the deposition wall 201. However, the height of the deposition wall 101 is selected such that a region onto which the first sub-pixel material should be deposited (the first sub-pixel region 1) is not occluded, and thus the first sub-pixel material is deposited only in the first sub-pixel region 1 adjacent to the second deposition wall 201. The occluded region is adjacent to the first deposition wall 101. The height of the first deposition wall 101 is h1, the distance by which the first deposition wall 101 and the second deposition wall 201 are spaced apart is L1, and the width of the first sub-pixel region 1 in the first direction is b1. The height h1 of the first deposition wall 101 can be calculated by using the following formula (1).

$$h1 = (L1 - b1) \times \tan(\alpha 1) \quad (1).$$

Figure 4:
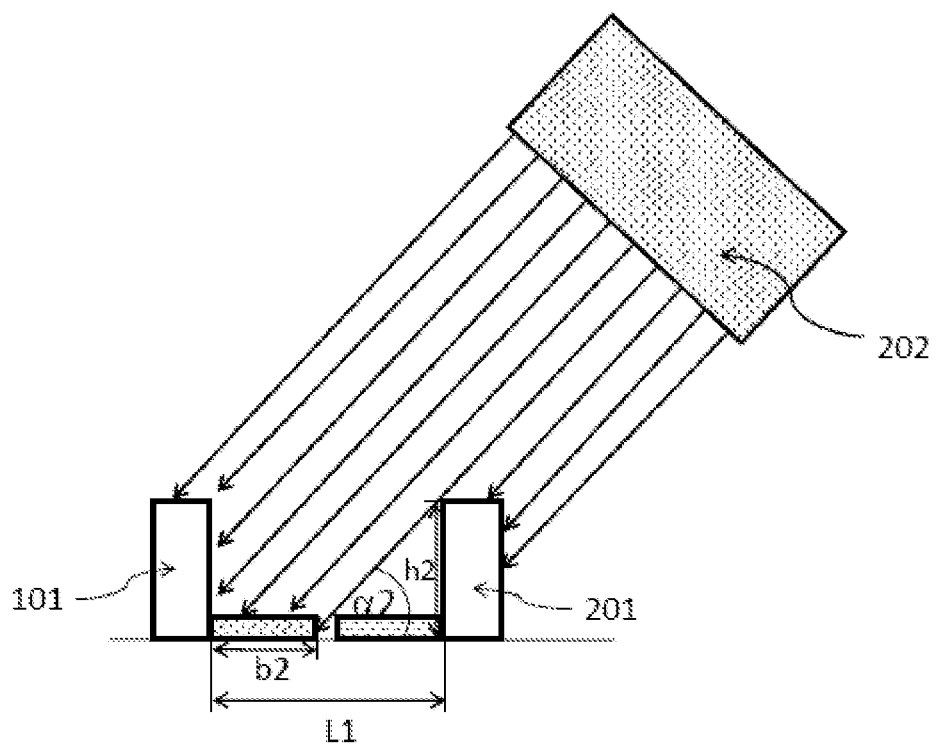
FIG. 4 is a schematic view for deposition of materials of the second sub-pixel region from a second sub-pixel material source at an oblique angle α2 according to an embodiment of the present disclosure.

As shown in FIG. 4, the second sub-pixel material from the second material source 202 is deposited obliquely onto the second sub-pixel region 2 at an angle α2 towards the first deposition wall 101 in the first direction. During deposition of materials from the second material source 202, the deposition wall 201 forms an occluded region between the deposition wall 201 and the deposition wall 101. However, the height of the deposition wall 201 is selected such that a region onto which the second sub-pixel material should be deposited (the second sub-pixel region 2) is not occluded, and thus the second sub-pixel material is deposited only in the second sub-pixel region 2 adjacent to the first deposition wall 101. The occluded region is adjacent to the second deposition wall 201. The height of the second deposition wall 201 is h2, the distance by which the first deposition wall 101 and the second deposition wall 201 are spaced apart is L1, and the width of the second sub-pixel region 2 in the first direction is b2. The height h2 of the second deposition wall 201 can be calculated by using the following formula (2).

$$h2=(L1-b2)\times\tan(\alpha 2) \qquad (2).$$

Figure 5:
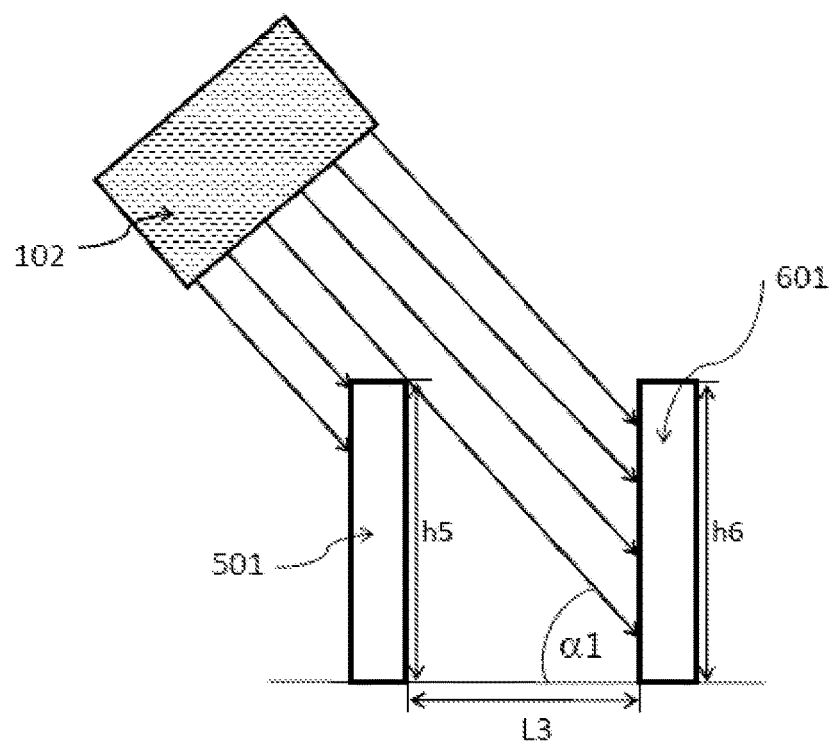
FIG. 5 is a schematic view showing that the third sub-pixel region is under protection during deposition of materials of the first sub-pixel region from the first sub-pixel material source.

As shown in FIG. 5, during deposition of materials of the first sub-pixel region 1 (i.e., the first sub-pixel material) from the first material source 102, the fifth deposition wall 501 and the sixth deposition wall 601 protect the third sub-pixel region 3. The fifth deposition wall 501 and the is sixth deposition wall 601 are spaced apart by a third distance L3, and have a height of h5 and h6 respectively. As can be seen from FIG. 5, in order to ensure that the third sub-pixel region 3 is under protection during deposition of the first sub-pixel material such that no material is deposited on the third sub-pixel region 3, the height h5 of the fifth deposition wall 501 should satisfy the following formula (3).

$$h5>L3\times\tan(\alpha 1) \qquad (3).$$

Figure 6:
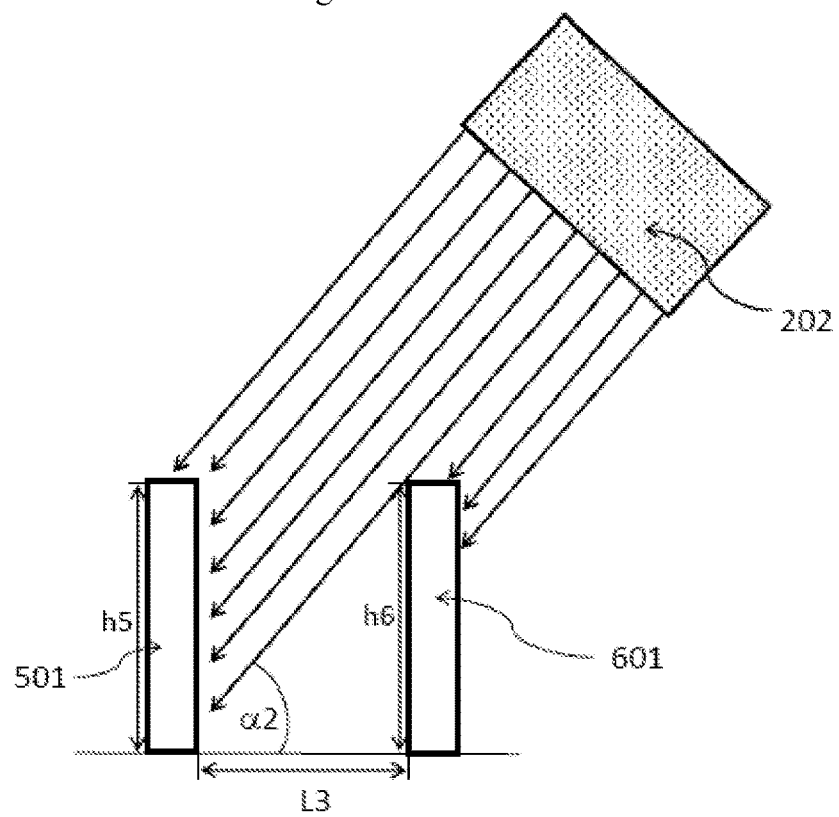
FIG. 6 is a schematic view showing that the third sub-pixel region is under protection during deposition of materials of the second sub-pixel region from the second sub-pixel material source.

As shown in FIG. 6, during deposition of materials of the second sub-pixel region 2 (i.e., the second sub-pixel material) from the second material source 202, the fifth deposition wall 501 and the sixth deposition wall 601 protect the third sub-pixel region 3. As can be seen from FIG. 6, in order to ensure that the third sub-pixel region 3 is under protection during deposition of the second sub-pixel material such that no material is deposited on the third sub-pixel region 3, the height h6 of the sixth deposition wall 601 should satisfy the following formula (4).

$$h6>L3\times\tan(\alpha 2) \qquad (4).$$

Figure 7:
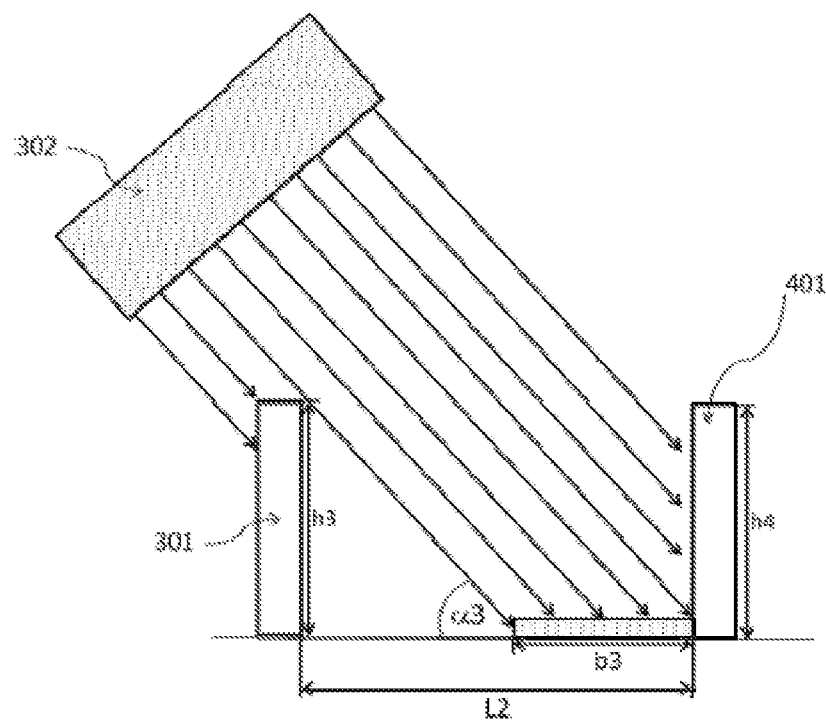
FIG. 7 is a schematic view for deposition of materials of the third sub-pixel region from a third sub-pixel material source at an oblique angle α3 according to an embodiment of the present disclosure.

As shown in FIG. 7, the third sub-pixel material from the third material source 302 is deposited obliquely onto the third sub-pixel region 3 at an angle α3 towards the fourth deposition wall 401 in the second direction. During deposition of materials from the third material source 302, the deposition wall 301 forms an occluded region between the deposition wall 301 and the deposition wall 401. However, the height of the deposition wall 301 is selected such that a region onto which the third sub-pixel material should be deposited (the third sub-pixel region 3) is not occluded, and thus the third sub-pixel material is deposited only in the third sub-pixel region 3 adjacent to the fourth deposition wall 401. The occluded region is adjacent to the third deposition wall 301. The height of the third deposition wall 301 is h3, the distance by which the third deposition wall 301 and the fourth deposition wall 401 are spaced apart is L2, and the width of the third sub-pixel region 3 in the second direction is b3. The height h3 of the third deposition wall 301 can be calculated by using the following formula (5):

$$h3=(L2-b3)\times\tan(\alpha 3) \qquad (5).$$

In the embodiments as shown in FIGS. 3-7, the first sub-pixel region 1 is formed first, then the second sub-pixel region 2 is formed, and finally the third sub-pixel region 3 is formed. However, the present disclosure does not limit the forming sequence of each sub-pixel region, which can be adjusted upon actual situations.

The oblique angles for forming the first sub-pixel region 1, the second sub-pixel region 2 and the third sub-pixel region 3 can be determined upon actual needs.

In an exemplary embodiment, the oblique angles α1, α2 and α3 can be unequal to each other. In another exemplary embodiment, at least two of α1, α2 and α3 are equal to each other. In this way, each of α1, α2 and α3 can be adjusted according to pixel design, and also upon specific process conditions and needs. Accordingly, the sub-pixel materials can be deposited more flexibly.

In an exemplary embodiment, α1, α2 and α3 can be equal to each other. In this case, when a pixel material has been deposited and a next sub-pixel material is ready to be deposited, it is possible to deposit each sub-pixel material at a fixed same angle α by only rotating either of a material container and the substrate with respect to the other, thereby simplifying the production process.

In an exemplary embodiment, as shown in FIG. 1, a conventional three sub-pixel design is adopted, wherein three sub-pixels are surrounded by deposition walls 101, 201, 301, 401, 501 and 601, and the three sub-pixels form one pixel. For example, each sub-pixel can be blue, red or green.

In an exemplary embodiment, as shown in FIG. 2, one pixel can also be formed by four sub-pixels surrounded by deposition walls 101, 201, 301, 401, 501 and 601, and the four sub-pixels form one pixel. The position and the size of each sub-pixel can be selected based on specific display designs.

Figure 8:
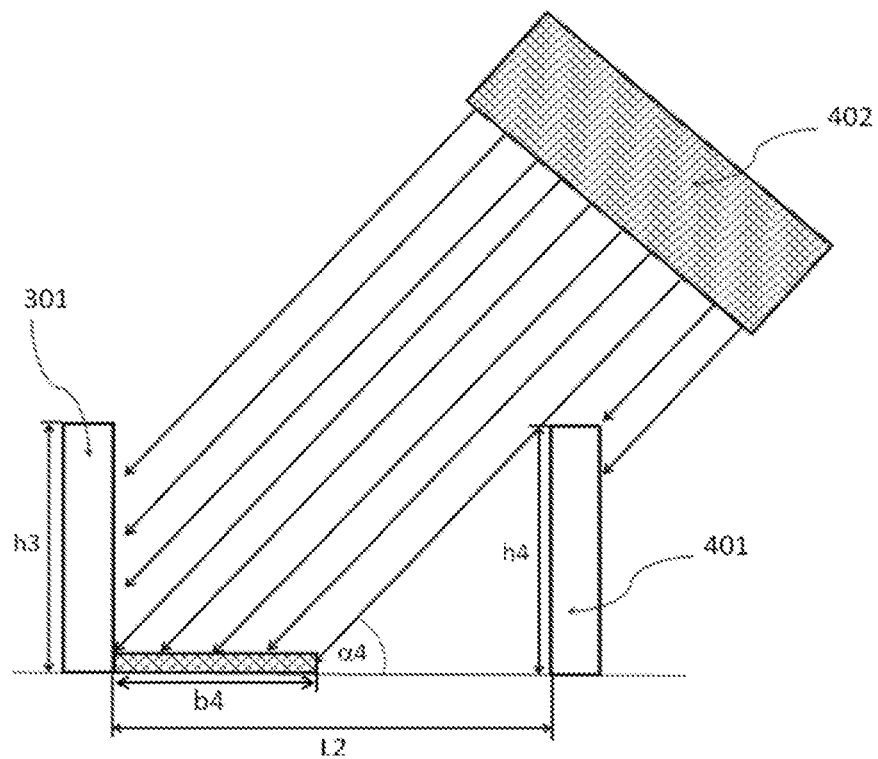
FIG. 8 is a schematic view for deposition of materials of the fourth sub-pixel region from a fourth sub-pixel material source at an oblique angle α4 according to an embodiment of the present disclosure.

As shown in FIG. 8, in the present embodiment, when a pixel is formed by four sub-pixels, the fourth sub-pixel material from the fourth material source 402 can be deposited obliquely onto the fourth sub-pixel region 4 at an angle α4 towards the third deposition wall 301 in the second direction. During deposition of materials from the fourth material source 402, the deposition wall 401 forms an occluded region between the deposition wall 301 and the deposition wall 401. However, the height of the deposition wall 401 is selected such that a region onto which the fourth sub-pixel material should be deposited (the fourth sub-pixel region 4) is not occluded, and thus the fourth sub-pixel material is deposited only in the fourth sub-pixel region 4 adjacent to the third deposition wall 301. The occluded region is adjacent to the fourth deposition wall 401. The height of the fourth deposition wall 401 is h4, the distance by which the third deposition wall 301 and the fourth deposition wall 401 are spaced apart is L2, and the width of the fourth sub-pixel region 4 in the second direction is b4. The height h4 of the fourth deposition wall 401 can be calculated by using the following formula (6):

$$h4=(L2-b4)\times\tan(\alpha 4) \qquad (6).$$

In an exemplary embodiment, the fourth sub-pixel material can differ from any of the first to the third sub-pixel materials. For example, the embodiment can be applied in an RGBW pixel layout comprising four sub-pixels of R (red), G (green), B (blue) and W (white), or in other pixel layouts requiring four sub-pixels.

In an exemplary embodiment, the fourth sub-pixel material can be the same as one of the other three sub-pixel materials. For example, it can be the same as the third sub-pixel material. Thereby, compensation for various parameters can be made upon needs.

In one exemplary embodiment, α4 is unequal to any of α1, α2 and α3.

In another exemplary embodiment, α4 is equal to at least one of α1, α2 and α3.

In the embodiment as shown in FIG. 1 and the embodiment as shown in FIG. 2, the height h5 of the fifth deposition wall 501 and the height h6 of the sixth deposition wall 601 are greater than the height h1 of the first deposition wall and the height h2 of the second deposition wall. Also, the first deposition wall 101 and the fifth deposition wall 501 have inner side walls located in a same plane, and the second deposition wall 201 and the sixth deposition wall 601 have inner side walls located in a same plane.

Figure 9:
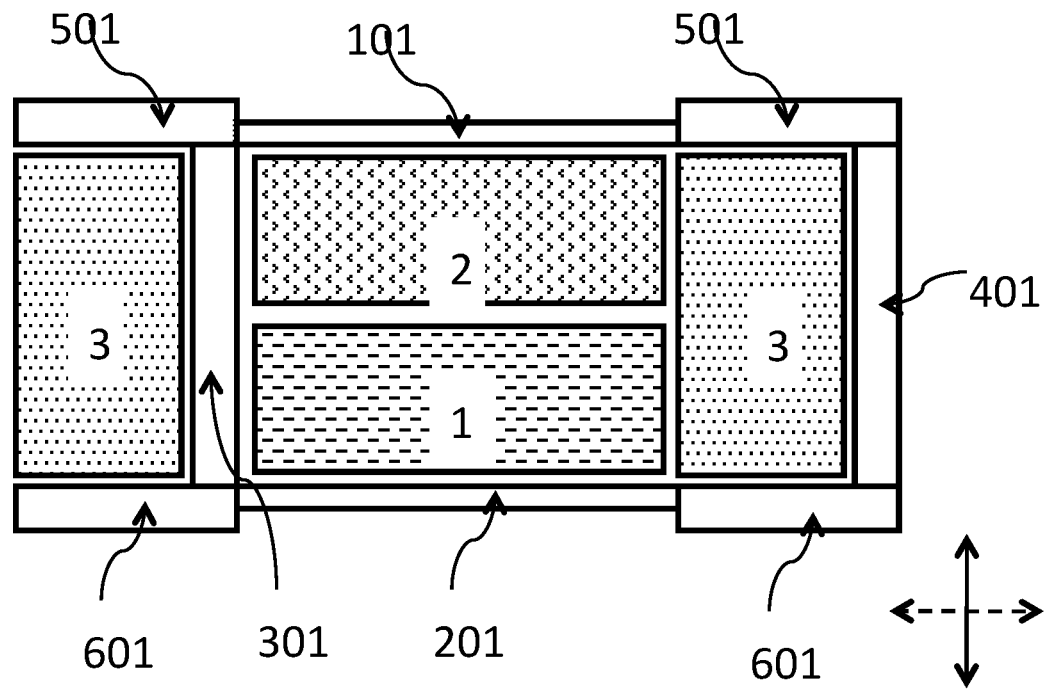
FIG. 9 is a plan view for a pixel region formed by three sub-pixel regions after deposition is completed according to an embodiment of the present disclosure.
Figure 10:
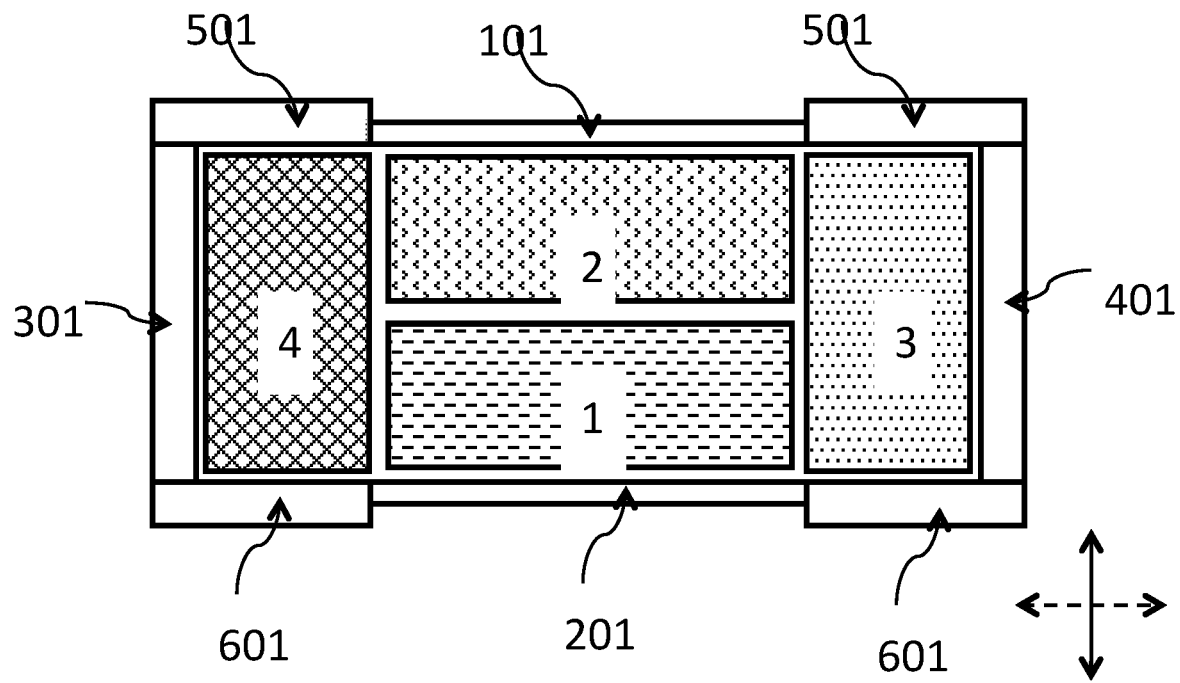
FIG. 10 is a plan view for a pixel region formed by four sub-pixel regions after deposition is completed according to another embodiment of the present disclosure.

FIG. 9 is a plan view for pixels after completion of the deposition according to the embodiment as shown in FIG. 1; and FIG. 10 is a plan view for pixels after completion of the deposition according to the embodiment as shown in FIG. 2.

As shown in FIG. 9, after the deposition is completed, the first sub-pixel region 1, the second sub-pixel region 2 and the third sub-pixel region 3 form a rectangular pixel region. As shown in FIG. 10, the first sub-pixel region 1, the second sub-pixel region 2, the third sub-pixel region 3 and the fourth sub-pixel region 4 also form a rectangular pixel region. The four sub-pixel regions can differ from each other, or any two of them can be the same. For example, in a four sub-pixel layout, each pixel can comprise a first sub-pixel region 1, a second sub-pixel region 2 and two third sub-pixel regions 3 (where the material of the fourth sub-pixel region 4 is replaced by that of the third sub-pixel region 3).

Figure 11:
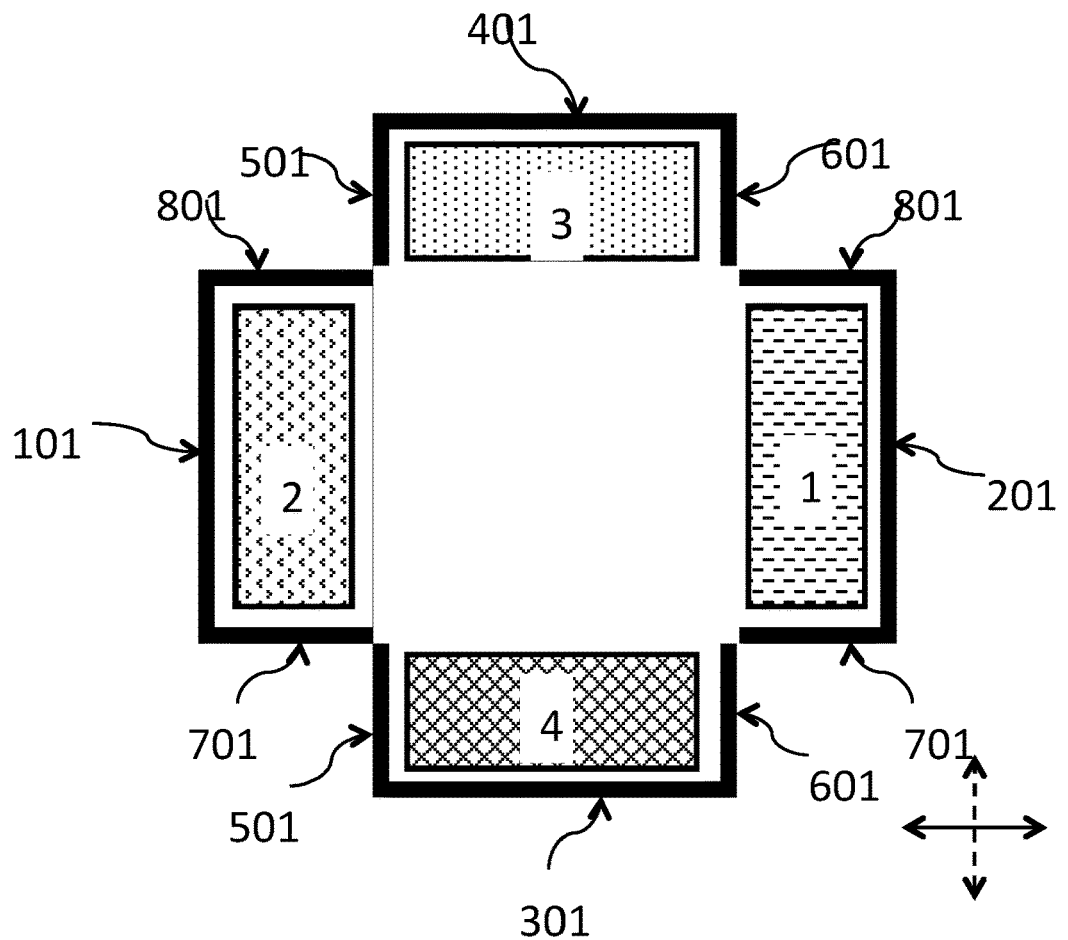
FIG. 11 is a plan view for a pixel region formed by four sub-pixel regions after deposition is completed according to yet another embodiment of the present disclosure.

Another exemplary embodiment of the present disclosure is described below with reference to FIG. 11. In FIG. 11, the deposition walls are indicated by thick solid lines.

As shown in FIG. 11, the deposition mask can comprise two pairs of the fifth deposition wall 501 and the sixth deposition wall 601, wherein a first pair of the fifth deposition wall 501 and the sixth deposition wall 601 and a second pair of the fifth deposition wall 501 and the sixth deposition wall 601 are respectively located on opposite sides of the first deposition wall 101 and the second deposition wall 201 arranged in pairs. The deposition mask further comprises two pairs of a seventh deposition wall 701 and an eighth deposition wall 801 arranged oppositely in parallel and spaced apart by a fourth distance L4 in the second direction, wherein a first pair of the seventh deposition wall 701 and the eighth deposition wall 801 and a second pair of the seventh deposition wall 701 and the eighth deposition wall 801 are respectively located on opposite sides of the third deposition wall 301 and the fourth deposition wall 401 arranged in pairs.

Similar to the embodiments as shown in FIGS. 1 and 2, in the embodiment as shown in FIG. 11, the heights of the first to the sixth deposition walls can satisfy the above relationships (1)-(6). Besides, when the third sub-pixel material of the third sub-pixel region 3 is deposited obliquely at an angle α3, a height h7 of the seventh deposition wall 701 needs to be designed as completely occluding the third sub-pixel material; likewise, when the fourth sub-pixel material of the fourth sub-pixel region 4 is deposited obliquely at an angle α4, a height h8 of the eighth deposition wall 801 needs to be designed as completely occluding the fourth sub-pixel material. Through analysis similar to the one for the fifth deposition wall and the sixth deposition wall (FIG. 5 and FIG. 6), it can be determined that the height h7 of the seventh deposition wall 701 and the height h8 of the eighth deposition wall 801 should satisfy the following relationships (7) and (8).

$$h7 > L4 \times \tan(\alpha 3) \quad (7),$$

$$h8 > L4 \times \tan(\alpha 4) \quad (8).$$

As shown in FIG. 11, in an embodiment, the first deposition wall 101 is offset towards the outside of the pixel region by a width b2 of the second sub-pixel region 2 in the first direction with relative to the fifth deposition wall 501, the second deposition wall 201 is offset towards the outside of the pixel region by a width b1 of the first sub-pixel region 1 in the first direction with relative to the sixth deposition wall 601, the third deposition wall 301 is offset towards the outside of the pixel region by a width b4 of the fourth sub-pixel region 4 in the second direction with relative to the seventh deposition wall 701, and the fourth deposition wall 401 is offset towards the outside of the pixel region by a width b3 of the third sub-pixel region 3 in the second direction with relative to the eighth deposition wall 801.

Herein, "inside" and "outside" refer to an inner side and an outer side of each corresponding pixel region with respect to the OLED panel.

Besides, it should be pointed out that in FIGS. 1, 2 and 9-11 of the present disclosure, for the sake of clarity, gaps are shown between each sub-pixel region and the inner side walls of respective deposition walls of the deposition mask. But, in fact, each sub-pixel region and the inner side walls of respective deposition walls of the deposition mask may have no gaps therebetween, as shown in FIGS. 3, 4, 7 and 8.

In the embodiment as shown in FIG. 11, the heights of the first to the eighth deposition walls can be designed upon specific needs. The heights of the first to the eighth deposition walls can differ from each other, or at least two of them can be the same.

In an embodiment, the first to the eighth deposition walls have the same height. In this embodiment, all the deposition walls have the same height. This makes the forming process of the deposition mask easier and thereby reduces the production cost.

After the deposition of all sub-pixel regions is completed, the deposition mask can be removed from the substrate by using a viscous binder material or by other means. For example, a binder film can be applied on top of the deposition mask, and then removed upwards together with the deposition mask. Accordingly, the deposition mask is separated from the substrate at the same time. However, the present disclosure is not limited thereto. In the OLED device or the OLED panel finally formed, the deposition mask can also be retained.

Figure 12A:
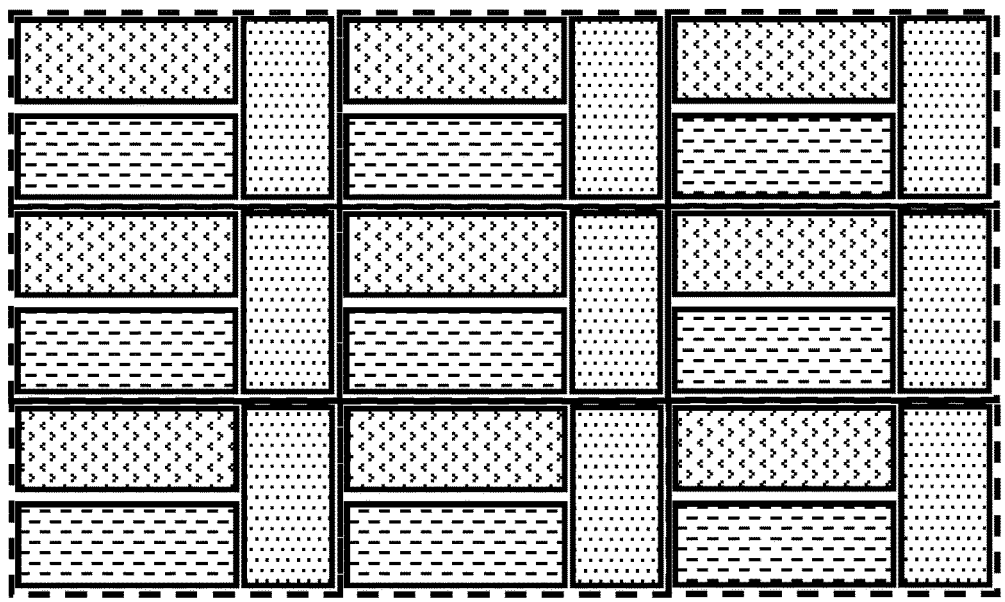
FIG. 12A is a plan view for a pixel array on an OLED display panel after completion of the deposition according to an embodiment of the present disclosure, wherein each pixel region is formed by three sub-pixel regions.

FIG. 12A is a plan view for each sub-pixel pattern formed on the display panel in the embodiment of FIG. 9, after the deposition mask is removed. After all sub-pixel materials are deposited, the patterned display region comprises a plurality of pixels, each pixel comprising three sub-pixels.

Herein, it should be noted that the dotted lines surrounding each pixel in FIG. 12A are only provided for distinguishing each pixel region, instead of necessarily representing deposition walls.

Figure 12B:
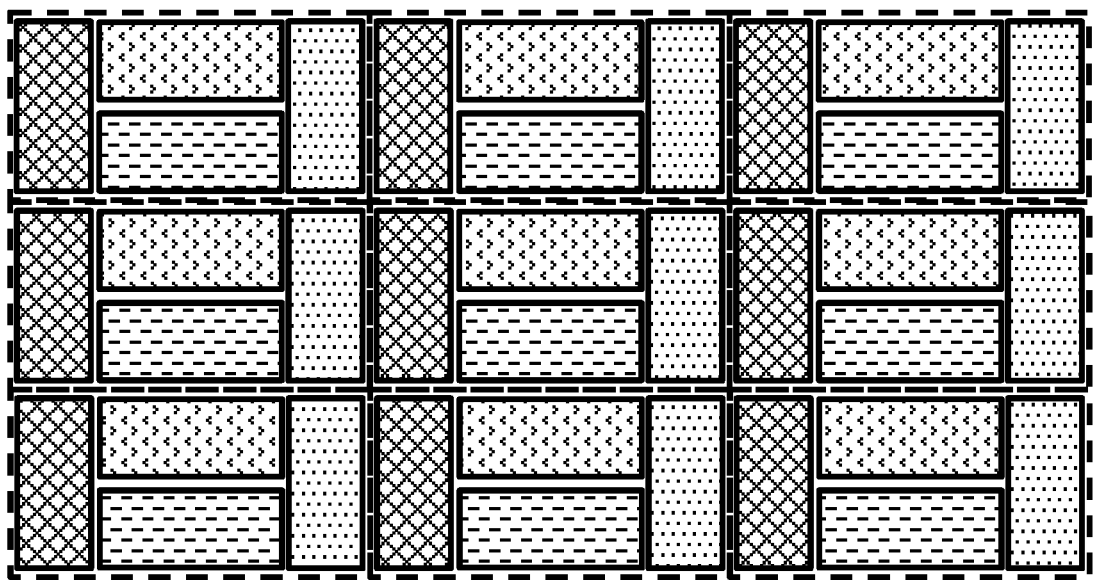
FIG. 12B is a plan view for a pixel array on an OLED display panel after completion of the deposition according to another embodiment of the present disclosure, wherein each pixel region is formed by four sub-pixel regions.

FIG. 12B is a plan view for each sub-pixel pattern formed on the display panel in the embodiment of FIG. 10, after the deposition mask is removed. After all sub-pixel materials are deposited, the patterned display region comprises a plurality of pixels, each pixel comprising four sub-pixels.

Herein, it should be noted that the dotted lines surrounding each pixel in FIG. 12B are only provided for distinguishing each pixel region, instead of necessarily representing deposition walls.

Figure 12C:
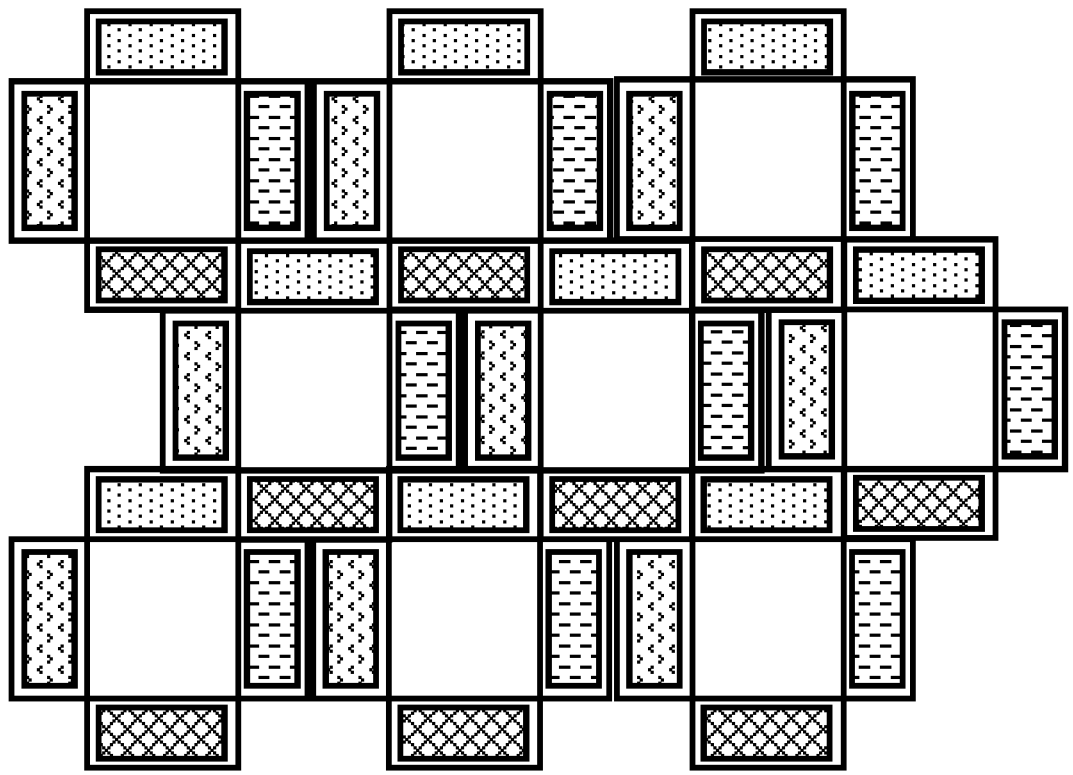
FIG. 12C is a plan view for a pixel array on the OLED display panel after completion of the deposition according to yet another embodiment of the present disclosure, wherein each pixel region is formed by four sub-pixel regions.

FIG. 12C is a plan view for each sub-pixel pattern formed on the display panel in the embodiment of FIG. 11, after the deposition mask is removed. After all sub-pixel materials are deposited, the patterned display region comprises a plurality of pixels, each pixel comprising four sub-pixels.

Herein, it should be noted that the solid lines surrounding each pixel in FIG. 12C are only provided for distinguishing each pixel region, instead of necessarily representing deposition walls.

In an embodiment of the present disclosure, the first, the second, the third and the fourth sub-pixel materials can be a material of the organic light-emitting layer of the OLED, or that of a layer with required micro-cavity lengths provided for each color in a top-emission type of OLED panel.

The thickness and the length for each deposition wall of the deposition mask are not specially limited, which can be set upon specific pixel designs.

An embodiment of the present disclosure further provides a mask structure for pixel layout of an OLED panel. The mask structure can be used in the above method for laying out pixels of an OLED panel.

Specifically, as shown in FIGS. 1-11, the deposition structure comprises a deposition mask patterned on a substrate and surrounding each pixel region. The deposition mask comprises: a first deposition wall 101 and a second deposition wall 201 arranged oppositely in parallel and in pairs and also spaced apart by a first distance L1 in a first direction, a third deposition wall 301 and a fourth deposition wall 401 arranged oppositely in parallel and in pairs and also spaced apart by a second distance L2 in a second direction intersecting the first direction, as well as a fifth deposition wall 501 and a sixth deposition wall 601 arranged oppositely in parallel and in pairs and also spaced apart by a third distance L3 in the first direction.

As shown in FIGS. 1, 2 and 9-11, the pixel layout comprises a first sub-pixel region 1 adjacent to the second deposition wall 201, a second sub-pixel region 2 adjacent to the first deposition wall 101, and a third sub-pixel region 3 adjacent to the fourth deposition wall 401. As shown in FIGS. 3 and 4, in a section obtained from cutting along the first direction, the substrate and a connection line from an inner edge of the first sub-pixel region 1 to a top portion of the first deposition wall 101 enclose an angle $\alpha 1$, and the substrate and a connection line from an inner edge of the second sub-pixel region 2 to a top portion of the second deposition wall 201 enclose an angle $\alpha 2$. As shown in FIG. 7, in a section obtained from cutting along the second direction, the substrate and a connection line from an inner edge of the third sub-pixel region 3 to a top portion of the third deposition wall 301 enclose an angle $\alpha 3$. $\alpha 1$, $\alpha 2$ and $\alpha 3$ are all greater than 0 degrees and smaller than 90 degrees.

As detailed above and shown in FIGS. 3-7, the heights of the first to the sixth deposition walls are respectively h1, h2, h3, h4, h5 and h6, the widths of the first sub-pixel region 1 and the second sub-pixel region 2 in the first direction are respectively b1 and b2, and the width of the third sub-pixel region 3 in the second direction is b3. In this case, the following relationships are satisfied:

$$h1=(L1-b1)\times\tan(\alpha 1);$$

$$h2=(L1-b2)\times\tan(\alpha 2);$$

$$h3=(L2-b3)\times\tan(\alpha 3);$$

$$h5>L3\times\tan(\alpha 1);$$

$$h6>L3\times\tan(\alpha 2).$$

In an embodiment of the present disclosure, as shown in FIGS. 2, 8, 10 and 11, the pixel layout can further comprise a fourth sub-pixel region 4 adjacent to the third deposition wall 301. As shown in FIG. 8, in a section obtained from cutting along the second direction, the substrate and a connection line from an inner edge of the fourth sub-pixel region 4 to a top portion of the fourth deposition wall 401 enclose an angle $\alpha 4$, wherein $\alpha 4$ is greater than 0 degrees and smaller than 90 degrees. A width of the fourth sub-pixel region 4 in the second direction is b4, and the following relationship is satisfied:

$$h4=(L2-b4)\times\tan(\alpha 4).$$

In an embodiment of the present disclosure, $\alpha 1$, $\alpha 2$ and $\alpha 3$ are unequal to each other.

In an embodiment of the present disclosure, at least two of $\alpha 1$, $\alpha 2$ and $\alpha 3$ are equal to each other.

In an embodiment of the present disclosure, $\alpha 4$ is unequal to any of $\alpha 1$, $\alpha 2$ and $\alpha 3$.

In an embodiment of the present disclosure, $\alpha 4$ is equal to at least one of $\alpha 1$, $\alpha 2$ and $\alpha 3$.

In an embodiment of the present disclosure, as shown in FIGS. 1, 2, 9 and 10, the height h5 of the fifth deposition wall 501 and the height h6 of the sixth deposition wall 601 are greater than the height h1 of the first deposition wall 101 and the height h2 of the second deposition wall 201. Further, the first deposition wall 101 and the fifth deposition wall 501 have inner side walls located in a same plane, and the second deposition wall 201 and the sixth deposition wall 601 have inner side walls located in a same plane.

In an embodiment of the present disclosure, as shown in FIG. 11, the deposition mask can comprise two pairs of the fifth deposition wall 501 and the sixth deposition wall 601, wherein a first pair of the fifth deposition wall 501 and the sixth deposition wall 601 and a second pair of the fifth deposition wall 501 and the sixth deposition wall 601 are respectively located on opposite sides of the first deposition wall 101 and the second deposition wall 201 arranged in pairs. The deposition mask can further comprise two pairs of a seventh deposition wall 701 and an eighth deposition wall 801 arranged oppositely in parallel and spaced apart by a fourth distance L4 in the second direction. A first pair of the seventh deposition wall 701 and the eighth deposition wall 801 and a second pair of the seventh deposition wall 701 and the eighth deposition wall 801 are respectively located on opposite sides of the third deposition wall 301 and the fourth deposition wall 401 arranged in pairs.

In order that no material is deposited on the first and the second pixel regions during the deposition of the third and the fourth pixel regions, a height h7 of the seventh deposition wall 701 and a height h8 of the eighth deposition wall 801 should satisfy the following relationships:

$$h7>L4\times\tan(\alpha 3);$$

$$h8>L4\times\tan(\alpha 4).$$

As shown in FIG. 11, the first deposition wall 101 can be offset towards the outside of the pixel region by a width b2 of the second sub-pixel region 2 in the first direction with relative to the fifth deposition wall 501, the second deposition wall 201 can be offset towards the outside of the pixel region by a width b 1 of the first sub-pixel region 1 in the first direction with relative to the sixth deposition wall 601, the third deposition wall 301 can be offset towards the outside of the pixel region by a width b4 of the fourth sub-pixel region 4 in the second direction with relative to the seventh deposition wall 701, and the fourth deposition wall 401 can be offset towards the outside of the pixel region by a width b3 of the third sub-pixel region 3 in the second direction with relative to the eighth deposition wall 801.

In an embodiment of the present disclosure, the first deposition wall to the eighth deposition wall can have the same height.

In an embodiment of the present disclosure, the first direction can be orthogonal to the second direction.

In an embodiment of the present disclosure, the deposition mask can be formed by photoresist.

In an embodiment of the present disclosure, the deposition mask can be made of one or more selected from the group consisting of photosensitive polyimide, polyacrylates, phenolic resin, and epoxy resin.

In an embodiment of the present disclosure, the substrate can be a TFT panel.

As shown in FIGS. 1, 2, 9-11 and 12A-12C, the OLED pixel structure according to the embodiments of the present disclosure comprises a first sub-pixel region 1, a second sub-pixel region 2 and a third sub-pixel region 3, wherein the first sub-pixel region 1 and the second sub-pixel region 2 are aligned in a first direction, extending in parallel with each other in a second direction intersecting the first direction, and the third sub-pixel region 3 is located at one end of the first and the second sub-pixel regions in the second direction, extending in the first direction.

The pixel structure according to the embodiments of the present disclosure can be formed without a mask requiring accurate alignment.

In an embodiment of the present disclosure, as shown in FIGS. 2, 10, 11, 12B and 12C, the OLED pixel structure can further comprise a fourth sub-pixel region 4 located at the other end of the first and the second sub-pixel regions in the second direction, extending in the first direction, wherein the third sub-pixel region 3 and the fourth sub-pixel region 4 are aligned with each other in the second direction.

In an embodiment of the present disclosure, the material of the fourth sub-pixel region 4 can be the same as that of one of the first to the third sub-pixel regions. For example, the material of the fourth sub-pixel region 4 can be the same as that of the third sub-pixel region 3.

In an embodiment of the present disclosure, as shown in FIGS. 1, 2, 9 and 10, two sides of the third sub-pixel region 3 in the first direction can be aligned with outer sides of the first sub-pixel region 1 and the second sub-pixel region 2 in the first direction respectively.

In an embodiment of the present disclosure, as shown in FIGS. 2 and 10, two sides of the fourth sub-pixel region 4 in the first direction can be aligned with outer sides of the first to the third sub-pixel regions in the first direction respectively.

In an embodiment of the present disclosure, as shown in FIGS. 11 and 12C, an outer side of the third sub-pixel region 3 in the second direction and an outer side of the fourth sub-pixel region 4 in the second direction can be respectively offset outwards by a width of the third sub-pixel region 3 and a width of the fourth sub-pixel region 4 with relative to two outer sides of the first sub-pixel region 1 and the second sub-pixel region 2 (that are arranged in pairs) in the second direction; and an outer side of the first sub-pixel region 1 in the first direction and an outer side of the second sub-pixel region 2 in the first direction are respectively offset outwards by a width of the first sub-pixel region 1 and a width of the second sub-pixel region 2 with respect to two outer sides of the third sub-pixel region 3 and the fourth sub-pixel region 4 (that are arranged in pairs) in the first direction.

In an embodiment of the present disclosure, the first direction can be orthogonal to the second direction.

In an embodiment of the present disclosure, the materials of the first to the fourth sub-pixel regions can be a material of the organic light-emitting layer of the OLED.

In an embodiment of the present disclosure, the width b of each sub-pixel region falls within the range of 1-200 μm. In another embodiment, the width b of each sub-pixel region falls within the range of 5-50 μm. In yet another embodiment, the width b of each sub-pixel region falls within the range of 15 μm.

In an embodiment of the present disclosure, the deposition angle α for materials of each sub-pixel region falls within the range of 1-89 degrees. In another embodiment of the present disclosure, the deposition angle α falls within the range of 15-60 degrees. In yet another embodiment of the present disclosure, the deposition angle α falls within the range of 30 degrees.

The distance L1 between the deposition walls 101 and 201 can be equal to the distance L3 between the deposition walls 501 and 601, and fall within the range of 2-400 μm, optionally within the range of 12-105 μm, and optionally take the value of 35 μm. The distance L2 between the deposition walls 301 and 401 can fall within the range of 3-600 μm, optionally within the range of 18-160 μm, and optionally take the value of 50 μm.

Based on the above values or value ranges as well as formulas (1)-(8), the heights h1 and h2 of the deposition walls can fall within the range of 0.02-10000 μm. In one embodiment, the heights h1 and h2 of the deposition walls can fall within the range of 1.8-95 μm. In one embodiment, the heights h1 and h2 of the deposition walls can take the value of 11 μm; and the heights h3, h4, h5 and h6 of the deposition walls can fall within the range of 0.05-34000 μm. In another embodiment, the heights h3, h4, h5 and h6 of the deposition walls can fall within the range of 4.8-165 μm. In yet another embodiment, the heights h3, h4, h5 and h6 of the deposition walls can take the value of 20 μm.

The above values are all applicable to the layout represented by FIG. 9.

For the layout represented by FIG. 10, L2 and L4 can optionally take the value of 65 μm, h3, h4, h5 and h6 can optionally take the value of 37 μm, and the rest values and ranges can be the same as those applicable to the layout represented by FIG. 9.

For the layout represented by FIG. 11, the pixel width and the deposition angle are respectively identical to those mentioned above. L1, L2, L3 and L4 can fall within the range of 4-800 μm, optionally within the range of 20-200 μm, and optionally take the value of 60 μm. All of the first to the eighth deposition walls can have the same height falling within the range of 0.07-45000 μm, optionally within the range of 5.4-346 μm, and optionally take the value of 34 μm.

However, it should be noted that the ranges of each parameter given here are only intended for exemplary purposes, instead of limiting the present disclosure. One skilled in the art can properly modify the above ranges and values upon actual needs.

Based on the above embodiments of the present disclosure, the sub-pixel materials (especially for the organic light-emitting layer) can be deposited easily and accurately to form pixel regions even when the motherboard glass is of the sixth generation or above, since no fine metal mask requiring accurate alignment with the substrate is needed.

In the description of the present disclosure, a number of specific details are provided. However, it can be understood that the embodiments of the present disclosure can be carried out without these specific details. In some embodiments, commonly known methods, structures and techniques are not detailed so as not to obscure the understanding of the description.

Finally, it should be noted that the above embodiments are only used for illustrating the technical solutions of the present disclosure rather than limiting it. Although the present disclosure has been illustrated in detail with reference to the above embodiments, one having ordinary skills in the art should understand that he/she can still modify the technical solutions stated in each of the above embodiments, or equivalently substitute part of the technical features therein. Further, these modifications or substitutions do not make the essence of the corresponding technical solutions depart from the spirits and scopes of the technical solutions of each embodiment of the present disclosure.

The invention claimed is:

1. A mask structure for pixel layout of an OLED panel, comprising:
a deposition mask patterned on a substrate and surrounding each pixel region, the deposition mask comprising a first deposition wall and a second deposition wall arranged oppositely in pairs in a first direction, a third deposition wall and a fourth deposition wall arranged oppositely in pairs in a second direction intersecting the first direction, as well as a fifth deposition wall and a sixth deposition wall arranged oppositely in pairs in the first direction,
wherein the pixel layout comprises a first sub-pixel region adjacent to the second deposition wall, a second sub-pixel region adjacent to the first deposition wall and a third sub-pixel region adjacent to the fourth deposition wall.

2. The mask structure according to claim 1, wherein the pixel layout comprises a fourth sub-pixel region adjacent to the third deposition wall.

3. The mask structure according to claim 1, wherein the first deposition wall and the second deposition wall are spaced apart by a first distance L1 in the first direction, the third deposition wall and the fourth deposition wall are spaced apart by a second distance L2 in the second direction, and the fifth deposition wall and the sixth deposition wall are spaced apart by a third distance L3 in the first direction,
in a section obtained from cutting along the first direction, the substrate and a connection line from an inner edge of the first sub-pixel region to a top portion of the first deposition wall enclose an angle $\alpha 1$, the substrate and a connection line from an inner edge of the second sub-pixel region to a top portion of the second deposition wall enclose an angle $\alpha 2$, and in a section obtained from cutting along the second direction, the substrate and a connection line from an inner edge of the third sub-pixel region to a top portion of the third deposition wall enclose an angle $\alpha 3$, wherein $\alpha 1$, $\alpha 2$ and $\alpha 3$ are all greater than 0 degrees and smaller than 90 degrees, and
wherein heights of the first to the sixth deposition walls are h1, h2, h3, h4, h5 and h6 respectively, which satisfy a relationship as follows:

$h5 > L3 \times \tan(\alpha 1)$;

$h6 > L3 \times \tan(\alpha 2)$.

4. The mask structure according to claim 2, wherein
in a section obtained from cutting along the second direction, the substrate and a connection line from an inner edge of the fourth sub-pixel region to a top portion of the fourth deposition wall enclose an angle $\alpha 4$, wherein $\alpha 4$ is greater than 0 degrees and smaller than 90 degrees.

5. The mask structure according to claim 3, wherein at least two of $\alpha 1$, $\alpha 2$ and $\alpha 3$ are equal to each other.

6. The mask structure according to claim 4, wherein $\alpha 4$ is equal to at least one of $\alpha 1$, $\alpha 2$ and $\alpha 3$.

7. The mask structure according to claim 3, wherein
the height h5 of the fifth deposition wall and the height h6 of the sixth deposition wall are greater than the height h1 of the first deposition wall and the height h2 of the second deposition wall, the first deposition wall and the fifth deposition wall having inner side walls located in a same plane, and the second deposition wall and the sixth deposition wall having inner side walls located in a same plane.

8. The mask structure according to claim 4, wherein
the deposition mask comprises two pairs of the fifth deposition wall and the sixth deposition wall, wherein a first pair of the fifth deposition wall and the sixth deposition wall and a second pair of the fifth deposition wall and the sixth deposition wall are respectively located on opposite sides of the first deposition wall and the second deposition wall arranged in pairs, and
the deposition mask further comprises two pairs of a seventh deposition wall and an eighth deposition wall arranged oppositely and spaced apart by a fourth distance L4 in the second direction, wherein a first pair of the seventh deposition wall and the eighth deposition wall and a second pair of the seventh deposition wall and the eighth deposition wall are respectively located on opposite sides of the third deposition wall and the fourth deposition wall arranged in pairs,
heights of the seventh deposition wall and the eighth deposition wall are h7 and h8 respectively, which satisfy a relationship as follows:

$h7 > L4 \times \tan(\alpha 3)$;

$h8 > L4 \times \tan(\alpha 4)$, wherein the first deposition wall is offset towards outside of the pixel region by a width b2 of the second sub-pixel region in the first direction with respect to the fifth deposition wall, the second deposition wall is offset towards outside of the pixel region by a width b1 of the first sub-pixel region in the first direction with respect to the sixth deposition wall, the third deposition wall is offset towards outside of the pixel region by a width b4 of the fourth sub-pixel region in the second direction with respect to the seventh deposition wall, and the fourth deposition wall is offset towards outside of the pixel region by a width b3 of the third sub-pixel region in the second direction with respect to the eighth deposition wall.

9. The mask structure according to claim 8, wherein the first deposition wall to the eighth deposition wall have a same height.

10. The mask structure according to claim 1, wherein the deposition mask is made of at least one selected from a group consisting of photosensitive polyimide, polyacrylates, phenolic resin and epoxy resin.

11. The mask structure according to claim 3, wherein h1 and h2 fall within a range of 1.8~95 μm, and h3, h4, h5 and h6 fall within a range of 4.8~165 μm.

12. The mask structure according to claim 9, wherein the height of each of the first to the eighth deposition walls falls within a range of 5.4~346 μm.

13. An OLED panel comprising:
a pixel structure comprising a first sub-pixel region, a second sub-pixel region and a third sub-pixel region, wherein the first sub-pixel region and the second sub-pixel region are aligned in a first direction, extending in parallel with each other in a second direction intersecting the first direction, and the third sub-pixel region is located at one end of the first and the second sub-pixel regions in the second direction, extending in the first direction,
wherein the pixel structure further comprises a fourth sub-pixel region located at another end of the first and the second sub-pixel regions in the second direction, extending in the first direction, wherein the third sub-pixel region and the fourth sub-pixel region are aligned with each other in the second direction.

14. The OLED panel according to claim 13, wherein two sides of the third sub-pixel region in the first direction are aligned with outer sides of the first sub-pixel region and the second sub-pixel region in the first direction respectively.

15. The OLED panel according to claim 13, wherein two sides of the fourth sub-pixel region in the first direction are aligned with outer sides of the first sub-pixel region, the second sub-pixel region and the third sub-pixel region in the first direction respectively.

16. The OLED panel according to claim 13, wherein an outer side of the third sub-pixel region in the second direction and an outer side of the fourth sub-pixel region in the second direction are respectively offset outwards by a width of the third sub-pixel region and a width of the fourth sub-pixel region with respect to two outer sides of the first sub-pixel region and the second sub-pixel region, that are arranged in pairs, in the second direction, and
an outer side of the first sub-pixel region in the first direction and an outer side of the second sub-pixel region in the first direction are respectively offset outwards by a width of the first sub-pixel region and a width of the second sub-pixel region with respect to two outer sides of the third sub-pixel region and the fourth sub-pixel region, that are arranged in pairs, in the first direction.

17. The OLED panel according to claim 13, further comprising:
a deposition mask patterned and surrounding the pixel structure, the deposition mask comprising a first deposition wall and a second deposition wall arranged oppositely in pairs in a first direction, a third deposition wall and a fourth deposition wall arranged oppositely in pairs in a second direction intersecting the first direction, as well as a fourth deposition wall and a fifth deposition wall arranged oppositely in pairs in the first direction, wherein
the first sub-pixel region is adjacent to the second deposition wall, the second sub-pixel region is adjacent to the first deposition wall, and the third sub-pixel region is adjacent to the fourth deposition wall.

18. The OLED panel according to claim 17, wherein
the first deposition wall and the second deposition wall are spaced apart by a first distance L1 in the first direction, the third deposition wall and the fourth deposition wall are spaced apart by a second distance L2 in the second direction, and the fifth deposition wall and the sixth deposition wall are spaced apart by a third distance L3 in the first direction,
wherein in a section obtained from cutting along the first direction, the substrate and a connection line from an inner edge of the first sub-pixel region to a top portion of the first deposition wall enclose an angle α1, the substrate and a connection line from an inner edge of the second sub-pixel region to a top portion of the second deposition wall enclose an angle α2, and in a section obtained from cutting along the second direction, the substrate and a connection line from an inner edge of the third sub-pixel region to a top portion of the third deposition wall enclose an angle α3, wherein α1, α2 and α3 are all greater than 0 degrees and smaller than 90 degrees, and
wherein heights of the first to the sixth deposition walls are h1, h2, h3, h4, h5 and h6 respectively, which satisfy a relationship as follows:

$$h5 > L3 \times \tan(\alpha 1);$$

$$h6 > L3 \times \tan(\alpha 2).$$

19. The OLED panel according to claim 18, wherein
in a section obtained from cutting along the second direction, the substrate and a connection line from an inner edge of the fourth sub-pixel region to a top portion of the fourth deposition wall enclose an angle α4, wherein α4 is greater than 0 degrees and smaller than 90 degrees.

20. The OLED panel according to claim 19, wherein
the deposition mask comprises two pairs of the fifth deposition wall and the sixth deposition wall, wherein a first pair of the fifth deposition wall and the sixth deposition wall and a second pair of the fifth deposition wall and the sixth deposition wall are respectively located on opposite sides of the first deposition wall and the second deposition wall arranged in pairs, and
the deposition mask further comprises two pairs of a seventh deposition wall and an eighth deposition wall arranged oppositely and spaced apart by a fourth distance L4 in the second direction, wherein a first pair of the seventh deposition wall and the eighth deposition wall and a second pair of the seventh deposition wall and the eighth deposition wall are respectively located on opposite sides of the third deposition wall and the fourth deposition wall arranged in pairs,
wherein heights of the seventh deposition wall and the eighth deposition wall are h7 and h8 respectively, which satisfy a relationship as follows:

$$h7 > L4 \times \tan(\alpha 3);$$

$$h8 > L4 \times \tan(\alpha 4),$$

wherein the first deposition wall is offset towards outside of the pixel region by a width b2 of the second sub-pixel region in the first direction with respect to the fifth deposition wall, the second deposition wall is offset towards outside of the pixel region by a width b1 of the first sub-pixel region in the first direction with respect to the sixth deposition wall, the third deposition wall is offset towards outside of the pixel region by a width b4 of the fourth sub-pixel region in the second direction with respect to the seventh deposition wall, and the fourth deposition wall is offset towards outside of the pixel region by a width b of the third sub-pixel region in the second direction with e respect to the eighth deposition wall.

21. A method for manufacturing an OLED panel, comprising:
forming on a substrate a deposition mask patterned and surrounding each pixel region, the deposition mask comprising a first deposition wall and a second deposition wall arranged oppositely in pairs in a first direction, a third deposition wall and a fourth deposition wall arranged oppositely in pairs in a second direction intersecting the first direction, as well as a fifth deposition wall and a sixth deposition wall arranged oppositely in pairs in the first direction; and
depositing obliquely towards the second deposition wall in the first direction a first sub-pixel material onto a first sub-pixel region adjacent to the second deposition wall, depositing obliquely towards the first deposition wall in the first direction a second sub-pixel material onto a second sub-pixel region adjacent to the first deposition wall, and depositing obliquely towards the fourth deposition wall in the second direction a third sub-pixel material onto a third sub-pixel region adjacent to the fourth deposition wall.

22. The method for manufacturing an OLED panel according to claim 21, further comprising:
depositing obliquely towards the third deposition wall in the second direction a fourth sub-pixel material onto a fourth sub-pixel region adjacent to the third deposition wall.

23. The method for manufacturing an OLED panel according to claim 22, wherein
an oblique deposition angle of the fourth sub-pixel material is α4, wherein α4 is an angle enclosed between the substrate and a deposition direction of the fourth sub-pixel material, and is greater than 0 degrees and smaller than 90 degrees.

24. The method for manufacturing an OLED panel according to claim 23, wherein
the deposition mask comprises two pairs of the fifth deposition wall and the sixth deposition wall, wherein a first pair of the fifth deposition wall and the sixth deposition wall and a second pair of the fifth deposition wall and the sixth deposition wall are respectively located on opposite sides of the first deposition wall and the second deposition wall arranged in pairs, and
the deposition mask further comprises two pairs of a seventh deposition wall and an eighth deposition wall arranged oppositely and spaced apart by a fourth distance L4 in the second direction, wherein a first pair of the seventh deposition wall and the eighth deposition wall and a second pair of the seventh deposition wall and the eighth deposition wall are respectively located on opposite sides of the third deposition wall and the fourth deposition wall arranged in pairs,
heights of the seventh deposition wall and the eighth deposition wall are h7 and h8 respectively, which satisfy a relationship as follows:

$h7 > L4 \times \tan(\alpha 3)$;

$h8 > L4 \times \tan(\alpha 4)$, wherein the first deposition wall is offset towards outside of the pixel region by a width b2 of the second sub-pixel region in the first direction with respect to the fifth deposition wall, the second deposition wall is offset towards outside of the pixel region by a width b1 of the first sub-pixel region in the first direction with respect to the sixth deposition wall, the third deposition wall is offset towards outside of the pixel region by a width b4 of the fourth sub-pixel region in the second direction with respect to the seventh deposition wall, and the fourth deposition wall is offset towards outside of the pixel region by a width b3 of the third sub-pixel region in the second direction with respect to the eighth deposition wall.

25. The method for manufacturing an OLED panel according to claim 24, wherein the first deposition wall to the eighth deposition wall have a same height.

26. The method for manufacturing an OLED panel according to claim 25, wherein
each of the first to the eighth deposition walls has a height falling within a range of 5.4~346 μm.

27. The method for manufacturing an OLED panel according to claim 21, wherein
the first deposition wall and the second deposition wall are spaced apart by a first distance L1 in the first direction, the third deposition wall and the fourth deposition wall are spaced apart by a second distance L2 in the second direction, and the fifth deposition wall and the sixth deposition wall are spaced apart by a third distance L3 in the first direction,
oblique deposition angles of the first, the second and the third sub-pixel materials are α1, α2 and α3 respectively, wherein α1, α2 and α3 are angles enclosed between the substrate and deposition directions of the first, the second and the third sub-pixel materials respectively, and are all greater than 0 degrees and smaller than 90 degrees,
wherein heights of the first to the sixth deposition walls are h1, h2, h3, h4, h5 and h6 respectively, which satisfy a relationship as follows:

$h5 > L3 \times \tan(\alpha 1)$;

$h6 > L3 \times \tan(\alpha 2)$.

28. The method for manufacturing an OLED panel according to claim 27, wherein
the height h5 of the fifth deposition wall and the height h6 of the sixth deposition wall are greater than the height h1 of the first deposition wall and the height h2 of the second deposition wall, the first deposition wall and the fifth deposition wall having inner side walls located in a same plane, and the second deposition wall and the sixth deposition wall having inner side walls located in a same plane.

29. The method for manufacturing an OLED panel according to claim 27, wherein
h1 and h2 fall within a range of 1.8~95 μm, and h3, h4, h5 and h6 fall within a range of 4.8~165 μm.

* * * * *